(12) United States Patent
Karmaker

(10) Patent No.: US 10,199,997 B2
(45) Date of Patent: Feb. 5, 2019

(54) SOURCE-DEGENERATED AMPLIFICATION STAGE WITH RAIL-TO-RAIL OUTPUT SWING

(71) Applicant: QUALCOMM Incorporated, San Diego, CA (US)

(72) Inventor: Rahul Karmaker, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 15/178,251

(22) Filed: Jun. 9, 2016

(65) Prior Publication Data
US 2017/0359039 A1    Dec. 14, 2017

(51) Int. Cl.
*H03F 3/45*    (2006.01)
*H03F 3/26*    (2006.01)
*H01L 29/78*    (2006.01)
*H04W 84/04*    (2009.01)

(52) U.S. Cl.
CPC .......... *H03F 3/265* (2013.01); *H01L 29/785* (2013.01); *H03F 3/45179* (2013.01); *H03F 3/45197* (2013.01); *H03F 3/45264* (2013.01); *H04W 84/042* (2013.01); *H03F 3/45* (2013.01); *H03F 2200/498* (2013.01); *H03F 2203/45468* (2013.01); *H03F 2203/45496* (2013.01); *H03F 2203/45644* (2013.01)

(58) Field of Classification Search
CPC .... H03F 3/45; H03F 3/45179; H03F 3/45183; H03F 3/45188; H03F 1/307; H03F 3/30; H03F 3/3001; H03F 3/3022
USPC .......... 330/253, 255, 252, 262–264
See application file for complete search history.

(56) References Cited

U.S. PATENT DOCUMENTS

| | | | |
|---|---|---|---|
| 4,634,994 A * | 1/1987 | Wilhelm | H03F 1/48 330/252 |
| 5,736,892 A | 4/1998 | Lee | |
| 6,798,293 B2 * | 9/2004 | Casper | H03F 3/45183 330/253 |

(Continued)

FOREIGN PATENT DOCUMENTS

| | | |
|---|---|---|
| EP | 0161627 A1 | 11/1985 |
| EP | 0566990 A2 | 10/1993 |
| WO | WO-0223716 A2 | 3/2002 |

OTHER PUBLICATIONS

Ajjikuttira A., et al., "A Fully-Integrated CMOS RFIC for Bluetooth Applications," IEEE International Solid-State Circuits Conference, Session 13, Wireless LAN/13.2, 2001, pp. 198-199, 446.

(Continued)

*Primary Examiner* — Khanh V Nguyen
(74) *Attorney, Agent, or Firm* — Patterson & Sheridan, L.L.P.

(57) ABSTRACT

Certain aspects of the present disclosure generally relate to using cross-coupled transistors for source degeneration of an amplification stage. For example, the amplification stage generally includes a differential amplifier comprising transistors, cross-coupled transistors coupled to the differential amplifier, and an impedance coupled between drains of the cross-coupled transistors. In certain aspects, the differential amplifier comprises a push-pull amplifier, and the transistors of the push-pull amplifier comprise cascode-connected transistors.

27 Claims, 7 Drawing Sheets

(56) References Cited

U.S. PATENT DOCUMENTS

| | | | | |
|---|---|---|---|---|
| 6,980,050 | B2* | 12/2005 | Liu | H03F 3/45179 |
| | | | | 330/253 |
| 7,176,760 | B2 | 2/2007 | Jones | |
| 7,443,237 | B1 | 10/2008 | Liu | |
| 8,098,101 | B2* | 1/2012 | Savla | H03F 3/45188 |
| | | | | 330/253 |
| 8,305,247 | B2* | 11/2012 | Pun | H03F 3/45071 |
| | | | | 330/253 |
| 8,724,355 | B1 | 5/2014 | Pinkhasov et al. | |
| 2002/0149419 | A1 | 10/2002 | Feldman | |
| 2008/0079497 | A1 | 4/2008 | Fang et al. | |
| 2011/0115566 | A1* | 5/2011 | Moon | H03F 3/45188 |
| | | | | 330/253 |
| 2015/0155843 | A1 | 6/2015 | Scott et al. | |
| 2016/0072442 | A1* | 3/2016 | Testi | H03F 3/193 |
| | | | | 330/310 |
| 2016/0080181 | A1 | 3/2016 | Yun et al. | |

OTHER PUBLICATIONS

Ong G.T., et al., "A Micropower Gate-Bulk Driven Differential Difference Amplifier with Folded Telescopic Cascode Topology for Sensor Applications," 53rd IEEE International Midwest Symposium on Circuits and Systems, Aug. 2010, pp. 193-196.

Partial International Search Report—PCT/US2017/032661—ISA/EPO—Aug. 22, 2017.

International Search Report and Written Opinion—PCT/US2017/032661—ISA/EPO—Dec. 15, 2017.

Khumsat P., et al., "Single-stage CMOS OTA for Active-RC filter Design," Circuit Theory and Design, ECCTD 2007, 18th European Conference on IEEE, Piscataway, NJ, USA, Aug. 27, 2007, pp. 436-439, XP031257777.

* cited by examiner

SOURCE-DEGENERATED AMPLIFICATION STAGE WITH RAIL-TO-RAIL OUTPUT SWING

TECHNICAL FIELD

Certain aspects of the present disclosure generally relate to electronic circuits and, more particularly, to a circuit for signal amplification.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and BSs may include an amplifier having multiple amplification stages. For example, a first amplification stage of the amplifier may be implemented using a differential amplifier having high differential and common-mode input impedance and low gain for common-mode signals. The gain that may be obtained in the first amplification stage may be insufficient, and thus, a second amplification stage (i.e., gain stage) may be used. An output amplification stage may also be used to provide a low output impedance.

SUMMARY

Certain aspects of the present disclosure generally relate to a differential amplifier with source degeneration implemented using cross-coupled transistors.

Certain aspects of the present disclosure provide an amplification stage. The amplification stage generally includes a differential amplifier comprising transistors, first cross-coupled transistors coupled to the differential amplifier, and an impedance coupled between drains of the first cross-coupled transistors.

Certain aspects of the present disclosure provide a method for amplifying a signal. The method generally includes amplifying a differential input signal with an amplification stage comprising a differential amplifier comprising transistors, and degenerating sources of the transistors using first cross-coupled transistors coupled to the transistors of the differential amplifier.

Certain aspects of the present disclosure provide an amplifier. The amplifier generally includes a first amplification stage and a second amplification stage comprising a differential amplifier comprising transistors having gates coupled to a differential output of the first amplification stage, the transistors being coupled to a first voltage rail, cross-coupled transistors coupled between a second voltage rail and the differential amplifier, and an impedance coupled between drains of the cross-coupled transistors.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
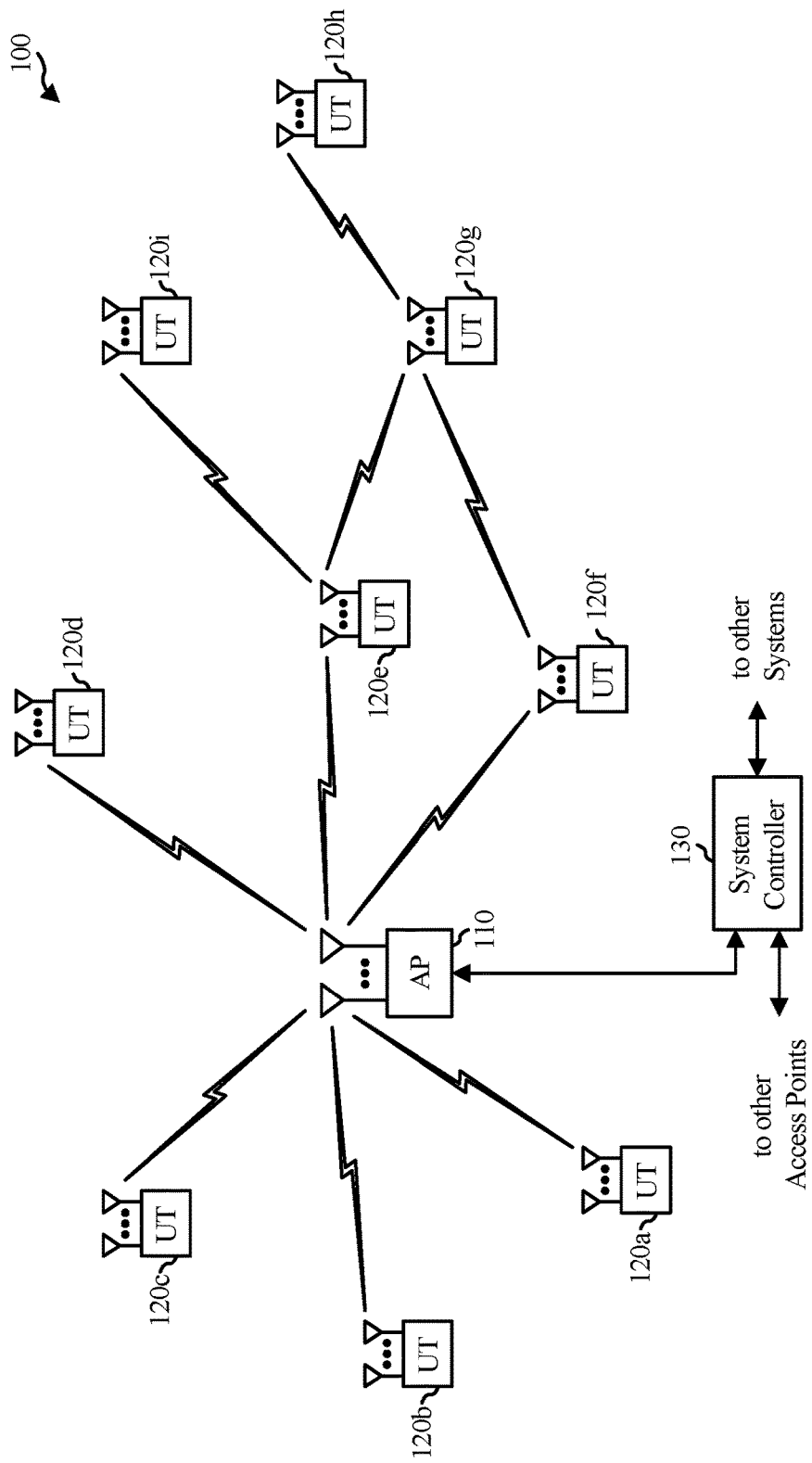
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 and/or user terminal 120 may include an amplifier having multiple amplification stages. At least one amplification stage of the amplifier may be implemented with a class-AB type amplifier. A source degeneration circuit for the class-AB amplifier may be implemented with cross-coupled transistors, in accordance with certain aspects of the present disclosure.

Figure 2:
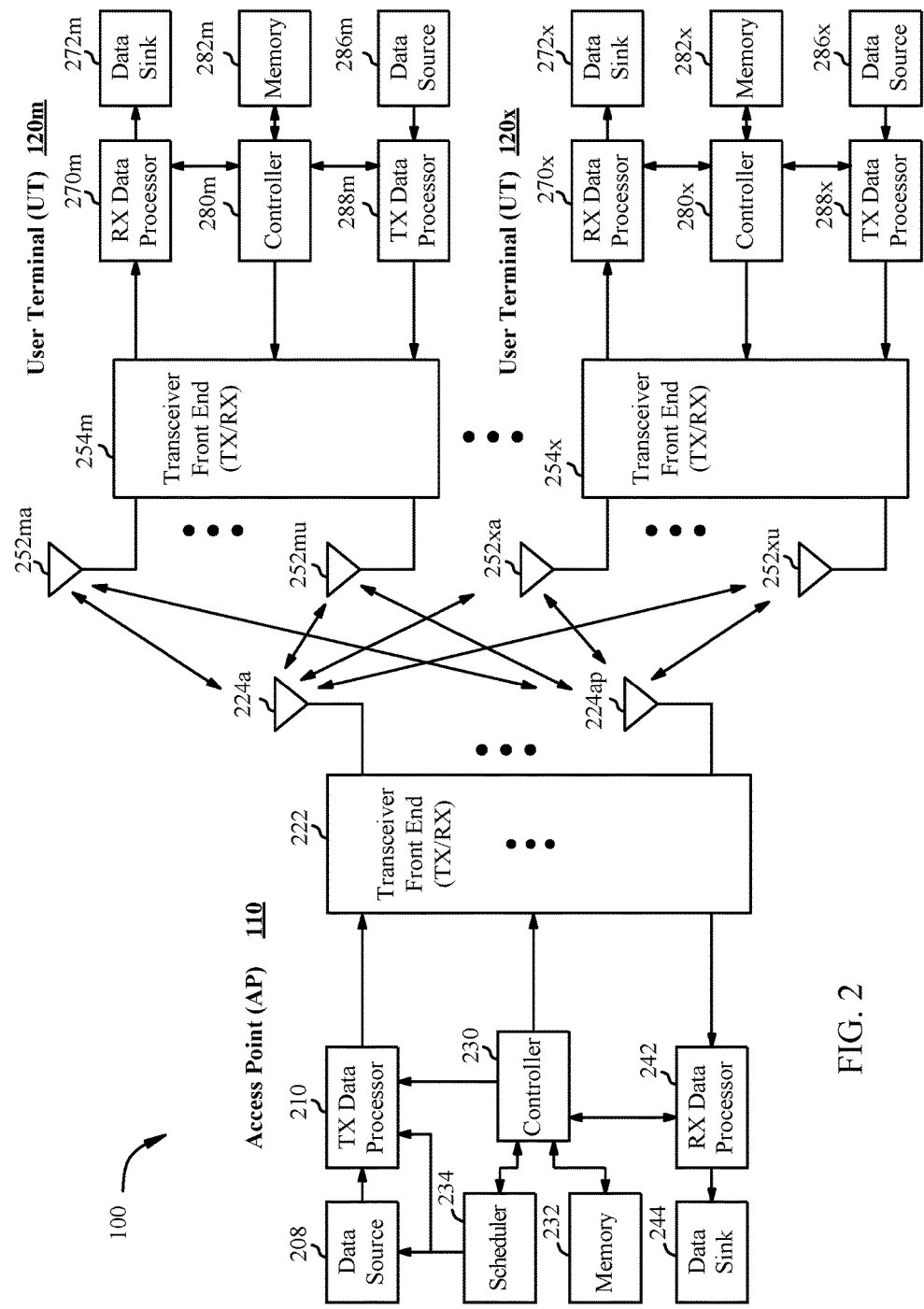
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream {$s_{up}$} for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream {$s_{up}$} transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include an amplifier having multiple amplification stages. At least one amplification stage of the amplifier may be implemented with a class-AB type amplifier. A source degeneration circuit for the class-AB amplifier may be implemented with cross-coupled transistors, in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
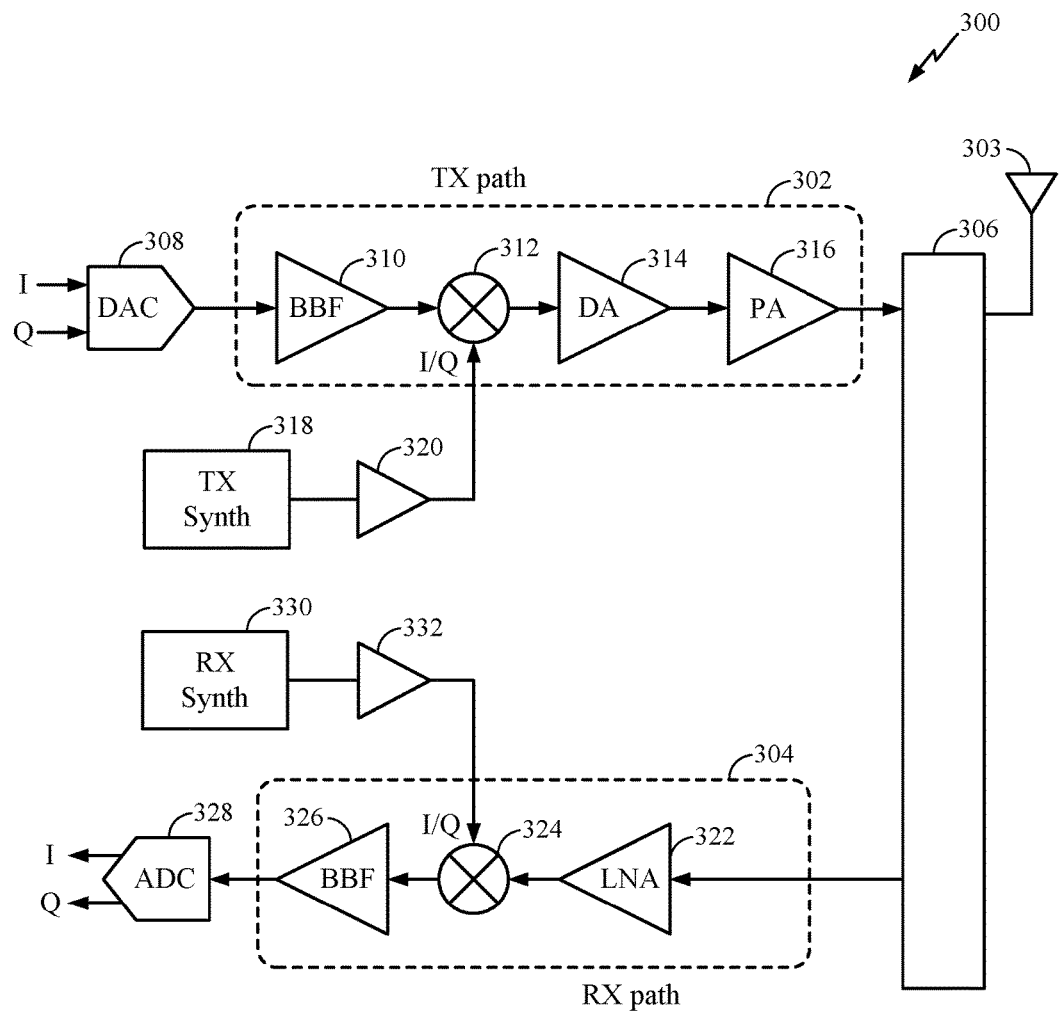
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, a baseband module, which may include the BBF 326, may include an amplifier having multiple amplification stages. At least one amplification stage of the amplifier may be implemented with a class-AB type amplifier. A source degeneration circuit for the class-AB amplifier may be implemented with cross-coupled transistors, in accordance with certain aspects of the present disclosure. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Source-Degenerated Amplification Stage

Amplifiers may be designed with multiple amplification stages. For example, a first amplification stage of an amplifier may be a differential amplifier having high differential and common-mode input impedance and low gain for common-mode signals. The gain that may be obtained in the first amplification stage may be insufficient, and thus, a second amplification stage (i.e., gain stage) may be used, as well as a third amplification stage. Noise signals arising in the first amplification stage may be subject to subsequent amplification in the second or third amplification stages of the amplifier. Thus, reduction of noise in the first amplification stage is desired.

In some cases, a class-AB amplifier may be used for the second amplification stage. A class-AB amplifier, which may otherwise be referred to as a push-pull amplifier, may include a pair of cascode-connected transistors or two pairs of cascode-connected transistors for amplification of a differential signal. An output amplification stage may also be used to provide a low output impedance, and in some cases, to provide power gain and increase voltage and current swing at the output of the amplifier.

The cascode-connected transistors of the class-AB amplifier of the second amplification stage may include transistors manufactured using fin field effect transistor (FinFET) technology (3D transistor technology). FinFETs may have a voltage threshold as low as 250 mV, even when using high voltage threshold transistors. This may cause problems with respect to the biasing of the class-AB amplifier transistors.

For example, the class-AB amplifier may be coupled to the first amplification stage having a low noise high-gain-bandwidth design. The first amplification stage may have at least 500 mV of headroom, and thus, may be unable to properly bias the class-AB amplifier having a voltage threshold that is lower than 500 mV (e.g., 250 mV). Therefore, with a class-AB amplifier stage having a low voltage threshold, it may be difficult to bias the class-AB amplifier stage without changing the transconductance (gm) to drain current (Id) ratio (gm/Id) of the class-AB amplifier transistors which may increase power consumption.

One example solution for this problem involves using a level-shifter stage between the first amplification stage and the class-AB amplifier. The level shifter may level shift the output signal of the first amplification stage such that the class-AB amplifier can be properly biased. However, using a level shifter may increase the power consumption of the amplifier. Another solution may be to implement a resistor or a diode degeneration circuit for the class-AB amplifier. To implement resistor degeneration, a resistor may be coupled to the source terminals of the transistors of the class-AB amplifier, and for diode degeneration, a diode (or a diode-connected transistor) may be coupled to the source terminals of the transistors of the class-AB amplifier.

The degeneration resistor or diode may be used to increase the headroom (e.g., by at least 250 mV) between the source terminals of the transistors of the class-AB amplifier and a reference potential. However, using a resistor or a diode degeneration circuit may reduce the amplifier output stage dynamic range. Aspects of the present disclosure are directed to a source degeneration circuit that can increase the voltage threshold headroom of a class-AB amplifier, but still allow rail-to-rail voltage swing at the output of the amplifier.

Figure 4:
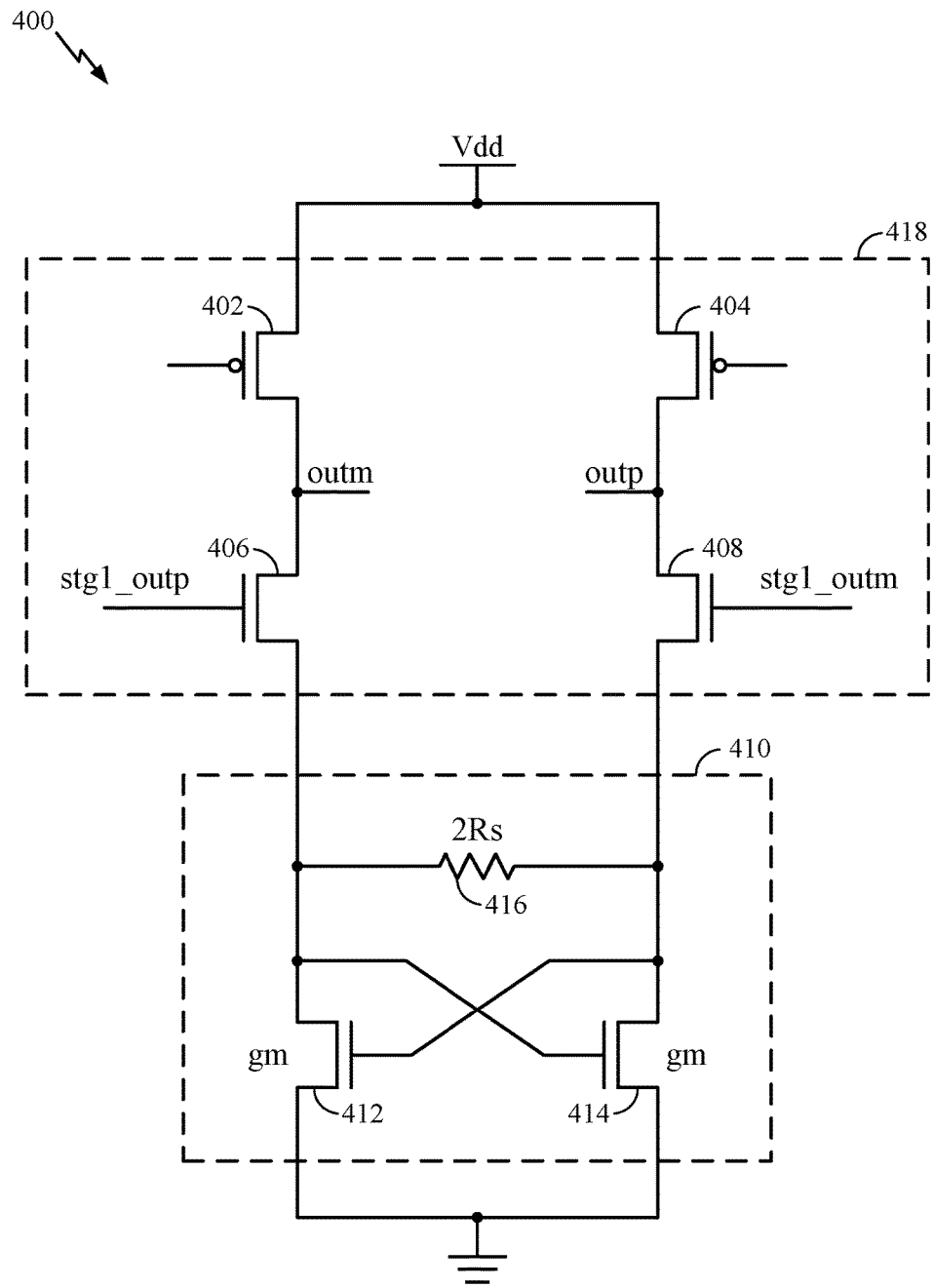
FIG. 4 illustrates an example amplification stage, in accordance with certain aspects of the present disclosure.

FIG. 4 illustrates an example amplification stage 400, in accordance with certain aspects of the present disclosure. The amplification stage 400 may be configured as a class-AB amplifier. For example, the amplification stage 400 includes a differential push-pull amplifier 418 including cascode-connected transistors. That is, p-type metal-oxide semiconductor (PMOS) transistors 402 and 404 may be connected in cascode with respective n-type metal-oxide semiconductor (NMOS) transistors 406 and 408. Sources of the PMOS transistors may be coupled to a voltage rail (Vdd). As illustrated, differential output signals (stg1_outp and stg1_outm) generated by the first amplification stage may be used to drive the gates of NMOS transistors 406 and 408. Moreover, a biasing circuit may be used to drive the gates of PMOS transistors 402 and 404 based on the differential output signals generated by the first amplification stage.

In certain aspects, a source degeneration circuit 410 may be coupled between the source terminals of the NMOS transistors 406 and 408 and a voltage rail having a reference potential (e.g., electrical ground or Vss). The source degeneration circuit 410 may increase the voltage headroom between the source terminals of the NMOS transistors 406 and 408 and the reference potential, such that the NMOS transistors 406 and 408 can be properly biased. The source degeneration circuit 410 may include cross-coupled transistors 412 and 414, which may be implemented using NMOS transistors. For example, gate of transistors 412 may be coupled to drain of transistor 414, and gate of transistors 414 may be coupled to drain of transistor 412. In certain aspects, the source degeneration circuit 410 also includes a resistor 416 coupled across the drain terminals of the cross-coupled transistors 412 and 414, as illustrated. A resistance of the resistor 416 may be about equal to 2×Rs, where:

$$Rs = \frac{1}{2 \times gm}$$

where gm is the transconductance of the transistor 412 or the transistor 414. The source degeneration circuit 410 allows for proper biasing of the amplification stage 400, while maintaining rail-to-rail voltage swing. The source degeneration circuit 410 may behave like a diode-connected degeneration circuit for a common-mode signal and may reduce the common-mode positive feedback gain and improve common-mode rejection (CMR). The source degeneration circuit 410 may introduce a small source degeneration for the differential loop of the class-AB amplifier. The amount of source degeneration provided by the source degeneration circuit 410 may be scalable by adjusting the value of the resistor 416.

Figure 5:
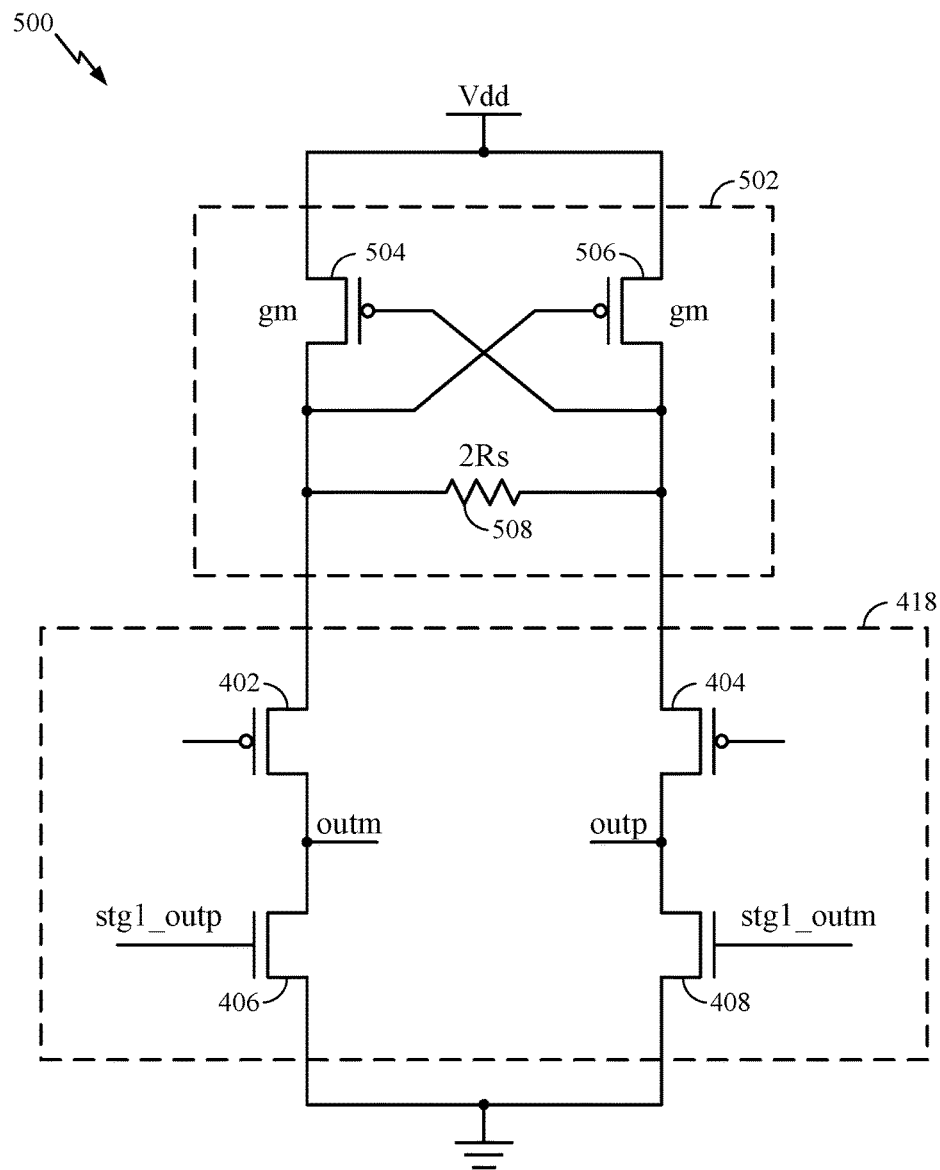
FIG. 5 illustrates an example amplification stage with source degeneration implemented for p-type metal-oxide semiconductor (PMOS) transistors of the amplification stage, in accordance with certain aspects of the present disclosure.

FIG. 5 illustrates an example amplification stage 500 with source degeneration implemented for PMOS transistors of the amplification stage 500, in accordance with certain aspects of the present disclosure. In some cases, it may be desirable to implement a source degeneration circuit 502 to increase the voltage headroom between the source terminals of the PMOS transistors 402 and 404 and the voltage rail Vdd. Thus, the source degeneration circuit 502 may be coupled between the voltage rail Vdd and the source of the PMOS transistors 402 and 404 such that the PMOS transistors 402 and 404 may be properly biased. The source degeneration circuit 502 may include cross-coupled PMOS transistors 504 and 506, and a resistor 508. A resistance of the resistor 508 may be about equal to 2×Rs, where:

$$Rs = \frac{1}{2 \times gm}$$

and where gm is the transconductance of the transistor 504 or the transistor 506. As presented above, the source degeneration circuit 502 may reduce the common-mode positive feedback gain and improve common-mode rejection (CMR). The source degeneration circuit 502 may introduce a small source degeneration for the PMOS transistors 504 and 506 with respect to the differential loop of the class-AB amplifier. The amount of source degeneration provided by the source degeneration circuit 502 may be scalable by adjusting the resistance of the resistor 508. In certain aspects, the resistor 416 and/or resistor 508 may be implemented using a polysilicon resistor, a metal resistor, a diffusion resistor, or an active transistor.

Figure 6:
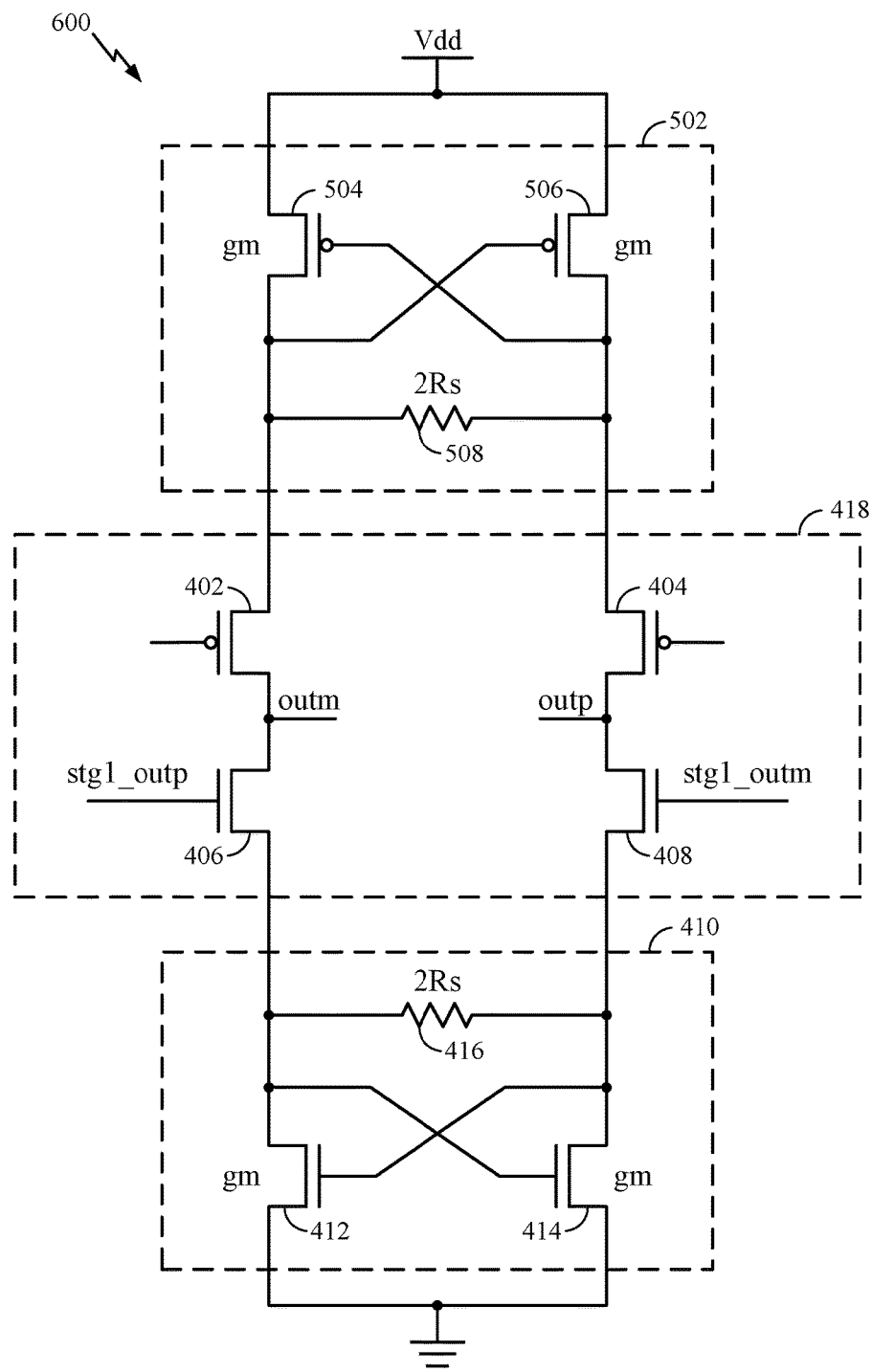
FIG. 6 illustrates an example amplification stage with source degeneration implemented for PMOS transistors and n-type metal-oxide semiconductor (NMOS) transistors of the amplification stage, in accordance with certain aspects of the present disclosure.

FIG. 6 illustrates an example amplification stage 600 with source degeneration implemented for PMOS transistors and NMOS transistors of the amplification stage 600, in accordance with certain aspects of the present disclosure. In some cases, it may be desirable to increase the headroom between the voltage rail Vdd and source terminals of PMOS transistors 402 and 404, as well as between the other voltage rail having the reference potential and source terminals of NMOS transistors 412 and 414. Thus, as illustrated, the source degeneration circuit 410 may be coupled between the NMOS transistors 412 and 414 and the voltage rail having the reference potential, and the source degeneration circuit 502 may be coupled between the PMOS transistors 402 and 404 and the voltage rail Vdd.

Figure 7:
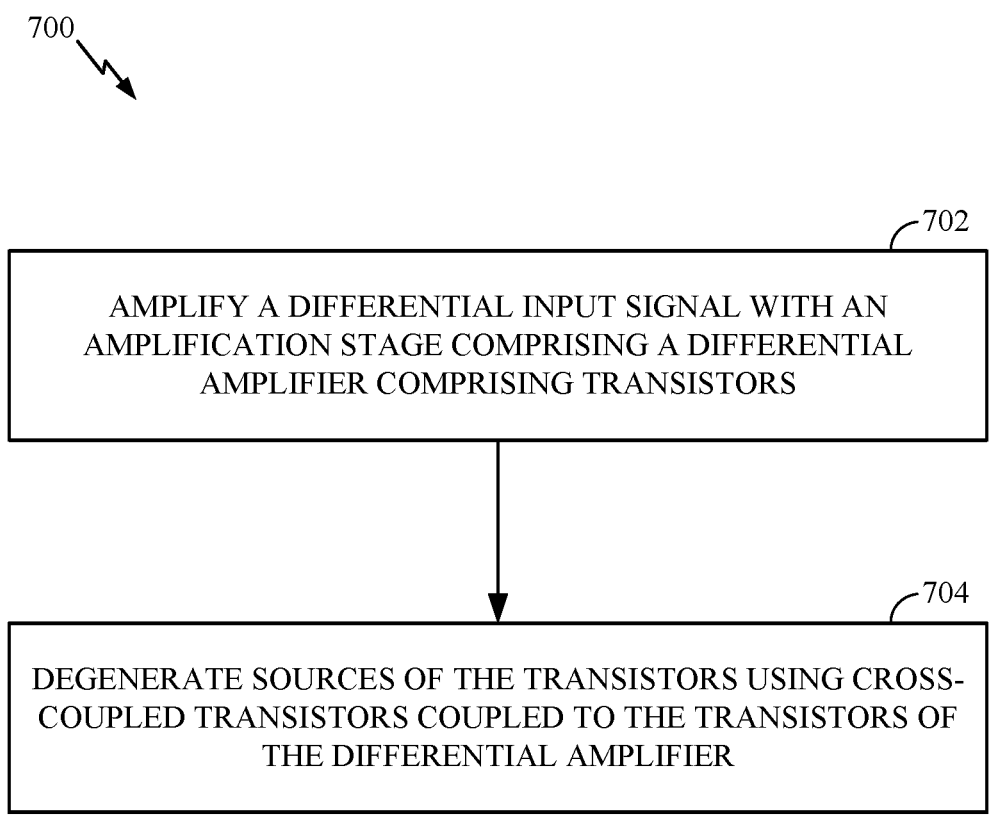
FIG. 7 is a flow diagram of example operations for amplifying a signal, in accordance with certain aspects of the present disclosure.

FIG. 7 is a flow diagram of example operations 700 for amplifying signals, in accordance with certain aspects of the present disclosure. The operations 700 may be performed by a circuit, such as the circuits of FIGS. 4-6.

The operations 700 may begin, at block 702, by amplifying a differential input signal with an amplification stage comprising a differential amplifier comprising transistors (e.g., transistors 406 and 408). At block 704, sources of the transistors may be degenerated using first cross-coupled transistors (e.g., cross-coupled transistors 412 and 414) coupled to the transistors of the differential amplifier.

In certain aspects, the differential amplifier may be a push-pull amplifier (e.g., differential amplifier 418), and the transistors of the push-pull amplifier may be connected in cascode. In certain aspects, an impedance may be coupled between drains of the first cross-coupled transistors. For example, the impedance may be implemented via a resistor (e.g., resistor 416). In some cases, a resistance of the resistor may be determined based on the transconductance of one of the first cross-coupled transistors. In certain aspects, degenerating the sources of the transistors may include using second cross-coupled transistors (e.g., cross-coupled transistors 502) coupled to the transistors of the differential amplifier.

In certain aspects, the differential amplifier may include first and second PMOS transistors and first and second NMOS transistors cascode-connected to the first and second PMOS transistors, respectively. For example, drains of the first and second NMOS transistors may comprise a differential output of the amplification stage, and in some cases, gates of the first and second NMOS transistors may comprise a differential input of the amplification stage.

In certain aspects, the transistors of the differential amplifier may be coupled to a first voltage rail. The first cross-coupled transistors may be PMOS transistors coupled between a second voltage rail (e.g., Vdd) and the differential amplifier. In this case, the second voltage rail may have a greater voltage than the first voltage rail. In certain aspects, the first cross-coupled transistors may comprise NMOS transistors coupled between a second voltage rail (e.g., electrical ground or Vss) and the differential amplifier. In this case, the first voltage rail may have a greater voltage than the second voltage rail.

In certain aspects, the second voltage rail comprises a reference potential, and the first voltage rail may have a voltage greater than the reference potential. In some cases, the differential amplifier may be a class-AB amplifier. In certain aspects, the transistors of the differential amplifier may comprise fin field effect transistors (FinFETs).

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An amplification stage comprising:
   a differential amplifier comprising transistors;
   first cross-coupled transistors coupled to sources of the transistors of the differential amplifier; and
   an impedance coupled between drains of the first cross-coupled transistors, wherein the differential amplifier comprises a push-pull amplifier, and wherein each of the transistors of the push-pull amplifier comprises a drain coupled to a drain of another transistor of the differential amplifier.

2. The amplification stage of claim 1, wherein the impedance comprises a resistor.

3. The amplification stage of claim 2, wherein the resistor is implemented via a polysilicon resistor, a metal resistor, a diffusion resistor, or an active transistor.

4. The amplification stage of claim 2, wherein a resistance of the resistor is based on a transconductance of one of the first cross-coupled transistors.

5. The amplification stage of claim 1, wherein:
   the other transistors of the differential amplifier are coupled to a first voltage rail; and
   the first cross-coupled transistors are coupled between a second voltage rail and the differential amplifier.

6. The amplification stage of claim 5, further comprising:
   second cross-coupled transistors coupled between the first voltage rail and the differential amplifier.

7. The amplification stage of claim 5, wherein the first cross-coupled transistors comprise PMOS transistors coupled between the second voltage rail and the differential amplifier and wherein the second voltage rail has a greater voltage than the first voltage rail.

8. The amplification stage of claim 5, wherein the first cross-coupled transistors comprise NMOS transistors coupled between the second voltage rail and the differential amplifier and wherein the first voltage rail has a greater voltage than the second voltage rail.

9. The amplification stage of claim 5, wherein the second voltage rail comprises a reference potential and wherein the first voltage rail has a voltage greater than the reference potential.

10. The amplification stage of claim 1, wherein the amplification stage comprises a class-AB amplification stage.

11. The amplification stage of claim 1, wherein the transistors of the differential amplifier comprise fin field effect transistors (FinFETs).

12. An amplification stage comprising:
    a differential amplifier comprising transistors, wherein the transistors of the differential amplifier are coupled to a first voltage rail;
    first cross-coupled transistors coupled to the transistors of the differential amplifier, wherein the first cross-coupled transistors are coupled between a second voltage rail and the differential amplifier;
an impedance coupled between drains of the first cross-coupled transistors;
second cross-coupled transistors coupled between the first voltage rail and the differential amplifier; and
another impedance coupled between drains of the second cross-coupled transistors.

13. An amplification stage comprising:
a differential amplifier comprising first transistors and second transistors;
first cross-coupled transistors coupled to sources of the transistors of the differential amplifier; and
an impedance coupled between drains of the first cross-coupled transistors, wherein the first transistors of the differential amplifier comprise
first and second p-channel metal-oxide semiconductor (PMOS) transistors; and
the second transistors of the differential amplifier comprise
first and second n-channel metal-oxide semiconductor (NMOS) transistors, each of the first and second NMOS transistors having a drain coupled to a drain of a respective one of the first and second PMOS transistors.

14. The amplification stage of claim 13, wherein the drains of the first and second NMOS transistors comprise a differential output of the amplification stage.

15. The amplification stage of claim 13, wherein gates of the first and second NMOS transistors comprise a differential input of the amplification stage.

16. A method for amplifying signals, comprising:
amplifying a differential input signal with an amplification stage comprising a differential amplifier comprising transistors; and
degenerating sources of the transistors using first cross-coupled transistors coupled to a source of the transistors of the differential amplifier, wherein the differential amplifier comprises a push-pull amplifier and wherein each of the transistors of the push-pull amplifier comprises a drain coupled to a drain of another transistor of the differential amplifier.

17. The method of claim 16, wherein an impedance is coupled between drains of the first cross-coupled transistors.

18. The method of claim 17, wherein the impedance comprises a resistor.

19. The method of claim 18, wherein a resistance of the resistor is based on a transconductance of one of the first cross-coupled transistors.

20. The method of claim 16, wherein degenerating the sources of the transistors further comprises using second cross-coupled transistors coupled to the other transistors of the differential amplifier.

21. The method of claim 16, wherein:
the transistors comprise
first and second p-channel metal-oxide semiconductor (PMOS) transistors; and
the others transistors comprise
first and second n-channel metal-oxide semiconductor (NMOS) transistors, each of the first and second NMOS transistors having a drain coupled to a drain of a respective one of the first and second PMOS transistors.

22. The method of claim 21, wherein the drains of the first and second NMOS transistors comprise a differential output of the amplification stage.

23. The method of claim 21, wherein gates of the first and second NMOS transistors comprise a differential input of the amplification stage.

24. The method of claim 16, wherein:
the other transistors of the differential amplifier are coupled to a first voltage rail;
the first cross-coupled transistors comprise PMOS transistors coupled between a second voltage rail and the differential amplifier; and
the second voltage rail has a greater voltage than the first voltage rail.

25. The method of claim 16, wherein:
the other transistors of the differential amplifier are coupled to a first voltage rail;
the first cross-coupled transistors comprise NMOS transistors coupled between a second voltage rail and the differential amplifier; and
the first voltage rail has a greater voltage than the second voltage rail.

26. The method of claim 25, wherein the second voltage rail comprises a reference potential and wherein the first voltage rail has a voltage greater than the reference potential.

27. The method of claim 16, wherein the transistors of the differential amplifier comprise fin field effect transistors (FinFETs).

* * * * *